(12) United States Patent
Leng

(10) Patent No.: US 12,015,052 B2
(45) Date of Patent: *Jun. 18, 2024

(54) METAL-INSULATOR-METAL (MIM) CAPACITOR MODULE INCLUDING A CUP-SHAPED STRUCTURE WITH A ROUNDED CORNER REGION

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

(*) Notice: Subject to any disclaimer, the term of this patent is extended or adjusted under 35 U.S.C. 154(b) by 164 days.

This patent is subject to a terminal disclaimer.

(21) Appl. No.: 17/747,302

(22) Filed: May 18, 2022

(65) Prior Publication Data

US 2023/0207615 A1     Jun. 29, 2023

Related U.S. Application Data

(60) Provisional application No. 63/293,946, filed on Dec. 27, 2021.

(51) Int. Cl.
H01L 21/768     (2006.01)
H01L 23/522     (2006.01)
H01L 49/02      (2006.01)

(52) U.S. Cl.
CPC ........ *H01L 28/91* (2013.01); *H01L 21/76838* (2013.01); *H01L 23/5226* (2013.01); *H01L 28/92* (2013.01)

(58) Field of Classification Search
CPC .......... H01L 28/90–92; H01L 23/5223; H10B 12/038; H10B 12/0387; H10B 12/37
See application file for complete search history.

(56) References Cited

U.S. PATENT DOCUMENTS

| | | |
|---|---|---|
| 2002/0132489 A1 | 9/2002 | Chang .......................... 438/725 |
| 2007/0057306 A1* | 3/2007 | Nakamura .............. H01L 28/65 257/E27.088 |
| 2007/0269954 A1 | 11/2007 | Nakamura et al. ........... 438/381 |
| 2021/0091169 A1 | 3/2021 | Lin et al. |
| 2021/0265263 A1 | 8/2021 | Leng |
| 2023/0207614 A1* | 6/2023 | Leng ................... H01L 23/5223 257/534 |

OTHER PUBLICATIONS

International Search Report and Written Opinion, Application No. PCT/US2022/034835, 12 pages.

* cited by examiner

*Primary Examiner* — Jose R Diaz

(74) *Attorney, Agent, or Firm* — SLAYDEN GRUBERT BEARD PLLC

(57) ABSTRACT

A metal-insulator-metal (MIM) capacitor includes a bottom electrode cup, an insulator, and a top electrode. The bottom electrode cup includes a laterally-extending bottom electrode cup base and a bottom electrode cup sidewall extending upwardly from the laterally-extending bottom electrode cup base. The insulator includes an insulator cup formed in an opening defined by the bottom electrode cup, and a rounded insulator flange extending laterally outwardly and curving upwardly from the insulator cup, the rounded insulator flange covering an upper surface of the bottom electrode cup sidewall. The top electrode is formed in an opening defined by the insulator cup. The top electrode is insulated from the upper surface of the bottom electrode cup sidewall by the rounded insulator flange.

20 Claims, 11 Drawing Sheets

METAL-INSULATOR-METAL (MIM) CAPACITOR MODULE INCLUDING A CUP-SHAPED STRUCTURE WITH A ROUNDED CORNER REGION

RELATED PATENT APPLICATION

This application claims priority to commonly owned U.S. Provisional Patent Application No. 63/293,946 filed Dec. 27, 2021, the entire contents of which are hereby incorporated by reference for all purposes.

TECHNICAL FIELD

The present disclosure relates to integrated circuit components, and more particularly to metal-insulator-metal (MIM) capacitors formed in integrated circuits.

BACKGROUND

A metal-insulator-metal (MIM) capacitor is a capacitor constructed with a metal top electrode, a metal bottom electrode, and an insulator (dielectric) sandwiched between the two electrodes. MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (poly-oxide-poly) capacitors and MOM (metal-oxide-metal lateral flux) capacitors, due to lower resistance, better matching for analog circuits (e.g., matching device characteristics such as resistance and capacitance), and/or better signal/noise ratio.

MIM capacitors are typically constructed between two interconnect metal layers (e.g., aluminum layers), referred to as metal layers $M_x$ and $M_{x+1}$. For example, a MIM capacitor may be formed using an existing metal layer $M_x$ as the bottom plate (bottom electrode), constructing an insulator and a top plate (top electrode) over the bottom plate, and connecting an overlying metal layer $M_{x+1}$ to the top and bottom plates by respective vias. The top plate formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top electrode may be formed from titanium/titanium nitride (Ti/TiN), tantalum/tantalum nitride (Ta/TaN), or tungsten (W), for example.

Conventional MIM capacitors are typically expensive to build. For example, MIM capacitors typically require multiple additional mask layers and many additional process steps. In addition, conventional MIM capacitors typically require relatively large areas of silicon, resulting in inefficient area usage, particularly with large MIM capacitors. Further, in a conventional MIM capacitor, the top plate is typically thin and thus provides a high series resistance.

In addition, conventional MIM capacitors may have a low and/or unpredictable breakdown voltage. For example, hillocks formed on the capacitor bottom plate may create an uncontrolled low breakdown voltage of the capacitor. Hillock formation may be difficult to control in a conventional fabrication process. For example, hillocks may form on the bottom plate as a result of various heated process steps in the capacitor fabrication, including heat treatment steps and/or heated aluminum deposition steps (e.g., performed at 400° C.).

There is a need for MIM capacitors that can be manufactured at lower cost, with few or no added mask layers, with improved spatial density, and/or with improved breakdown voltage.

SUMMARY

A MIM capacitor module may include a bottom electrode including a bottom electrode cup, an insulator including an insulator cup formed in an interior of the bottom electrode cup, and a top electrode formed in an interior of the insulator cup. The bottom electrode cup may have a sidewall with a shortened height (e.g., by removing an upper portion or upper "lip" of the sidewall), and the insulator may include a rounded insulator flange extending laterally outwardly from the insulator cup to cover an upper surface of the shortened bottom electrode cup sidewall. The rounded insulator flange may thereby insulate the upper surface of the bottom electrode cup sidewall from the top electrode, e.g., to prevent shorting between the top electrode and bottom electrode. In some examples, a top electrode connection pad may be formed directly on the top electrode, and insulated from the shortened bottom electrode cup sidewall by the rounded insulator flange. As used herein, a "MIM capacitor module" includes the fundamental elements of an MIM capacitor, e.g., an insulator (dielectric) arranged between conductive electrodes (e.g., conductive plates), and may also include certain related elements, e.g., conductive elements providing electrical contact to the conductive electrodes.

In some examples, the bottom electrode cup sidewall may be vertically shortened by a CMP process using a soft or deformable polishing pad that forms a rounded depression by removing corner regions of a conformal metal layer and underlying dielectric region, which defines a bottom electrode cup having a shortened sidewall. The rounded insulator flange is formed in this rounded depression, and extends over the upper surface of the bottom electrode cup sidewall.

In some examples, the MIM capacitor module may be constructed concurrently with an interconnect structure. In some examples, the MIM capacitor module may be constructed using a damascene process with no added photomasks, as compared with a background IC fabrication process.

In some examples the MIM capacitor module provides a consistent breakdown voltage. For example, disclosed processes for forming the MIM capacitor module may avoid the presence of hillocks on the bottom electrode. In addition, the thickness of the top electrode and overlying top electrode connection pad (e.g., both formed from aluminum) may be large, and may provide a very low series resistance.

In some examples, the MIM capacitor module may be constructed between two metal interconnect layer, or between a silicided polysilicon layer and a metal-1 metal layer.

One aspect provides a MIM capacitor module including a bottom electrode cup, an insulator, and a top electrode. The bottom electrode cup includes a laterally-extending bottom electrode cup base, and a bottom electrode cup sidewall extending upwardly from the laterally-extending bottom electrode cup base. The insulator includes an insulator cup formed in an opening defined by the bottom electrode cup, and a rounded insulator flange extending laterally outwardly and curving upwardly from the insulator cup, the rounded insulator flange covering an upper surface of the bottom electrode cup sidewall. The top electrode is formed in an opening defined by the insulator cup. The top electrode is insulated from the upper surface of the bottom electrode cup sidewall by the rounded insulator flange.

In some examples, the top electrode includes a top electrode cap region extending laterally over the rounded insulator flange, wherein the rounded insulator flange is arranged between the top electrode cap region and the upper surface of the bottom electrode cup sidewall.

In some examples, the MIM capacitor module includes a top electrode connection pad formed on the top electrode, the top electrode connection pad extending laterally over the top electrode cap region.

In some examples, the MIM capacitor module includes a bottom electrode base, wherein the bottom electrode cup is formed on the bottom electrode base, a bottom electrode contact spaced laterally apart from the bottom electrode cup, the bottom electrode contact conductively connected to the bottom electrode base, and a bottom electrode connection pad formed over the bottom electrode contact and conductively connected to the bottom electrode contact.

In some examples, the MIM capacitor module includes a top electrode connection pad formed over and conductively connected to the top electrode, wherein the bottom electrode base is formed in a lower metal layer, and wherein the top electrode connection pad and the bottom electrode connection pad are formed in an upper metal layer.

In some examples, the lower metal layer comprises a silicided polysilicon layer, and the upper metal layer comprises an interconnect metal layer.

In some examples, the bottom electrode cup and the bottom electrode contact are formed from a conformal metal.

In some examples, the insulator cup includes an insulator cup sidewall including multiple insulator cup sidewall segments defining a closed-loop perimeter of the insulator cup sidewall, the insulator cup sidewall having a sidewall upper edge extending around the closed-loop perimeter of the insulator cup sidewall, and the rounded insulator flange extends radially outwardly from the sidewall upper edge and extends around the closed-loop perimeter of the insulator cup sidewall.

Another aspect provides an integrated circuit structure including an interconnect structure and a MIM capacitor module. The interconnect structure includes a lower interconnect element, an upper interconnect element, and an interconnect via between the lower interconnect element and the upper interconnect element. The MIM capacitor module includes a bottom electrode cup, an insulator, and a top electrode. The bottom electrode cup includes a laterally-extending bottom electrode cup base, and a bottom electrode cup sidewall extending upwardly from the laterally-extending bottom electrode cup base. The bottom electrode cup and the interconnect via are formed in a common dielectric region (i.e., in the same dielectric layer or region). The insulator includes an insulator cup formed in an opening defined by the bottom electrode cup, and a rounded insulator flange extending laterally outwardly and curving upwardly from the insulator cup, the rounded insulator flange covering an upper surface of the bottom electrode cup sidewall. The top electrode is formed in an opening defined by the insulator cup. The top electrode is insulated from the upper surface of the bottom electrode cup sidewall by the rounded insulator flange.

In some examples, the top electrode includes a top electrode cap region extending laterally over the rounded insulator flange, wherein the rounded insulator flange is arranged between the top electrode cap region and the upper surface of the bottom electrode cup sidewall.

In some examples, the bottom electrode cup and the interconnect via are formed from a common conformal metal in the common dielectric region.

In some examples, the integrated circuit structure includes a top electrode connection pad formed over and conductively connected to the top electrode, a bottom electrode base, wherein the bottom electrode cup is formed on the bottom electrode base, a bottom electrode contact spaced laterally apart from the bottom electrode cup and spaced laterally apart from the interconnect via, the bottom electrode contact conductively connected to the bottom electrode base, and a bottom electrode connection pad conductively connected to the bottom electrode contact.

In some examples, the lower interconnect element and the bottom electrode base are formed in a lower metal layer, the upper interconnect element, the top electrode connection pad, and the bottom electrode connection pad are formed in an upper metal layer, and the bottom electrode contact is formed in the common dielectric region.

Another aspect provides a method of forming an IC structure including a MIM capacitor module. The method includes forming a tub opening in a dielectric region, and depositing a conformal metal layer over the dielectric region and extending down into the tub opening, the deposited conformal layer defining (a) a conformal layer cup region in the tub opening and (b) a conformal layer lateral region extending laterally outwardly from a top of the conformal layer cup region. The method also includes performing a planarization process to remove a metal corner region of the conformal layer and an underlying dielectric corner region of the dielectric region, wherein the removal of metal corner region and the dielectric corner region defines a rounded depression in the conformal layer and dielectric region. A remaining portion of the conformal layer cup region defines a bottom electrode cup including (a) a bottom electrode cup base and (b) a bottom electrode cup sidewall extending upwardly from the bottom electrode cup base. The method also includes depositing an insulator layer forming (a) an insulator cup in an opening defined by the bottom electrode cup and (b) a rounded insulator flange extending laterally outwardly and upwardly from the insulator cup, the rounded insulator flange covering an upper surface of the bottom electrode cup sidewall. The method also includes depositing a top electrode layer over the insulator layer and extending into an opening defined by the insulator cup, wherein the top electrode layer includes a top electrode cap region extending over the rounded insulator flange, wherein the rounded insulator flange is arranged between the top electrode cap region and an upper surface of the bottom electrode cup sidewall. The method also includes removing upper portions of the top electrode layer, insulator layer, and conformal layer, wherein (a) a remaining portion of the top electrode layer defines a top electrode, and (b) a remaining portion of the insulator layer defines an insulator including the insulator cup and the rounded insulator flange. The method also includes forming a top electrode connection pad conductively connected to the top electrode. The top electrode is insulated from the upper surface of the bottom electrode cup sidewall by the rounded insulator flange.

In some examples, the planarization process comprises using a deformable polishing pad that protrudes into the tub opening and erodes the metal corner region and underlying dielectric corner region to form the rounded depression in the conformal metal layer and dielectric region.

In some examples, the planarization process comprises a CHIP process using a deformable polishing pad having a Shore D hardness below 40 Shore D, and in some examples below 25 Shore D.

In some examples, the method includes forming a top electrode connection pad conductively connected to the top electrode.

In some examples, the method includes forming a bottom electrode base in a lower metal layer, wherein the dielectric region is formed over the lower metal layer and wherein the tub opening is formed over the bottom electrode base.

In some examples, the lower metal layer comprises a metal interconnect layer.

In some examples, forming the bottom electrode base in the lower metal layer comprises forming a metal silicide on a polysilicon region.

In some examples, the method includes patterning and etching the dielectric region to concurrently form the tub opening and a bottom electrode contact opening, wherein depositing the conformal metal layer over the dielectric region extends down into the bottom electrode contact opening to define a bottom electrode contact, and forming a bottom electrode connection pad in a top metal layer, wherein the bottom electrode connection pad is conductively connected to the bottom electrode cup through the bottom electrode contact.

In some examples, the method includes forming a lower metal layer including a bottom electrode base and a lower interconnect element, forming the dielectric region over the lower metal layer, forming a bottom electric contact opening and an interconnect via opening in the dielectric region, wherein depositing the conformal metal layer over the dielectric region extends down into the bottom electric contact opening to form a bottom electric contact connected to the bottom electrode base, and down into the interconnect via opening to form an interconnect via connected to the lower interconnect element, and forming an upper metal layer including a top electrode connection pad connected to the top electrode, an upper interconnect element connected to the interconnect via, and a bottom electrode connection pad connected to the bottom electric contact.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
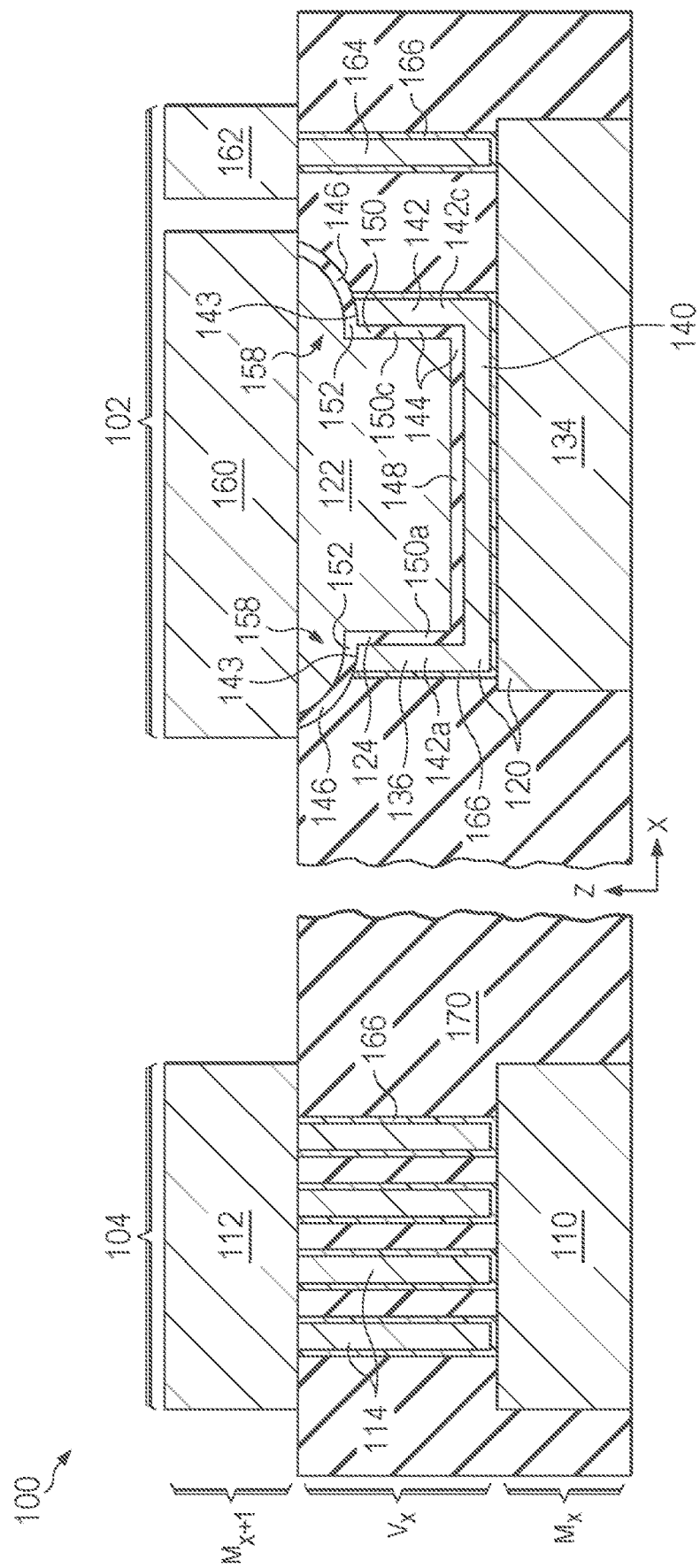
FIG. 1 is a side cross-sectional view showing an example IC structure including a MIM capacitor module and an interconnect structure formed concurrently, according to one example.

FIG. 1 is a side cross-sectional view showing an example IC structure 100 including a MIM capacitor module 102 and an interconnect structure 104 formed concurrently, according to one example. As discussed below, the MIM capacitor module 102 may be constructed without adding any photomask operations to the background integrated circuit fabrication process (e.g., the background integrated circuit fabrication process for forming the interconnect structure 104 and/or other IC elements). In other examples, the interconnect structure 104 may be optional, such that MIM capacitor module 102 described herein may be formed alone, i.e., not concurrently with an interconnect structure.

As shown in FIG. 1, the interconnect structure 104 may include a lower interconnect element 110 formed in a lower metal layer $M_x$ and an upper interconnect element 112 formed in an upper metal layer $M_{x+1}$ and connected to the lower interconnect element 110 by at least one interconnect via 114 formed in a via layer $V_x$ by depositing a conformal via material, e.g., tungsten, into respective via openings.

Each of the lower interconnect element 110 and upper interconnect element 112 may comprise a wire or other laterally elongated structure, or a discrete pad (e.g., having a square or substantially square shape from a top view), or any other suitable shape and structure.

As used herein, a "metal layer," for example in the context of a lower metal layer $M_x$ or upper metal layer $M_{x+1}$, may comprise any metal or metalized layer or layers, including (a) a metal interconnect layer, e.g., comprising copper, aluminum or other metal deposited by a subtractive patterning process (e.g., deposition, patterning, and etching of a metal layer) or using a damascene process, or (b) a silicided polysilicon layer including a number of polysilicon regions each having a layer or region of metal silicide formed thereon, or (c) any other patterned layer including at least one metal structure defining at least one component of a MIM capacitor. For example, in some examples the lower metal layer $M_x$ may be a silicided polysilicon layer and the upper metal layer $M_{x+1}$ may comprise a first metal interconnect layer, often referred to as metal-1. In such examples, x=0 such that the lower metal layer $M_x=M_0$ and the upper metal layer $M_{x+1}=M_1$ (i.e., metal-1). Further, as used herein, an "interconnect structure," e.g., in the context of the interconnect structure 104 discussed below, may include any type or types of metal layers as defined above.

The MIM capacitor module 102 includes a bottom electrode 120, a top electrode 122, and an insulator 124 formed between the bottom electrode 120 and top electrode 122. In the illustrated example, the MIM bottom electrode 120 includes (a) a bottom electrode base 134 formed in the lower metal layer $M_x$ and (b) a bottom electrode cup 136 formed on the bottom electrode base 134. The bottom electrode base 134 is formed in the lower metal layer $M_x$, e.g., as discussed below in more detail. The bottom electrode cup 136 is formed on the bottom electrode base 134 and includes (a) a laterally-extending bottom electrode cup base 140 and (b) a bottom electrode cup sidewall 142 extending upwardly from the laterally-extending bottom electrode cup base 140. In this example, the bottom electrode cup sidewall 142 extends upwardly from a lateral perimeter edge of the laterally-extending bottom electrode cup base 140. In some examples, the bottom electrode cup 136, a bottom electrode contact 164, and the interconnect vias 114 may formed concurrently in the via layer $V_x$, e.g., by depositing a conformal via material, e.g., tungsten, into respective openings formed in a dielectric region 170. In some examples, e.g., as discussed below with reference to FIG. 2B, the bottom electrode cup 136, bottom electrode contact 164, and interconnect vias 114 are formed over a liner 166, e.g., comprising TiN.

In another example, the bottom electrode base 134 may be omitted. For example, the bottom electrode cup 136 may be formed directly on a dielectric layer or region, e.g., an oxide region, e.g., after forming the tub opening 204 by an etch stopping on (or just below) a suitable etch stop layer.

As shown, an insulator 124 includes an insulator cup 144, a rounded insulator flange 146 extending laterally outwardly from the insulator cup 144. The insulator cup 144 is formed in an opening defined by the bottom electrode cup 136, and includes (a) a laterally-extending insulator cup base 148 and (b) an insulator cup sidewall 150 extending upwardly from the laterally-extending insulator cup base 148. In this example, the insulator cup sidewall 150 extends upwardly from a lateral perimeter edge of the laterally-extending insulator cup base 148.

The rounded insulator flange 146 extends laterally outwardly and upwardly from an upper edge 152 of the insulator cup sidewall 150, and extends laterally over an upper surface 143 of the bottom electrode cup sidewall 142. The rounded insulator flange 146 may have a rounded shape in a cross-sectional side view, e.g., as shown in FIG. 1. As discussed below with reference to FIGS. 2E-2F, the rounded insulator flange 146 may be formed on a concave depression formed by a chemical-mechanical polishing (CMP) process using a soft/deformable polishing pad. The upper surface 143 of the bottom electrode cup sidewall 142 may define part of the concave depression, and thus the upper surface 143 may have a concave curvature, as shown in FIG. 1.

In some examples, the bottom electrode cup sidewall 142 has a closed-loop perimeter in a horizontal (x-y) plane, the insulator cup sidewall 150 has a closed-loop perimeter in a horizontal (x-y) plane, the sidewall upper edge 152 extends around the closed-loop perimeter of the insulator cup sidewall 150, and the rounded insulator flange 146 extends radially outwardly from the closed-loop sidewall upper edge 152 and extends around the closed-loop perimeter of the insulator cup sidewall 142. The rounded insulator flange 146 may extend fully around the closed-loop perimeter of the insulator cup sidewall 142.

In the illustrated example:

(a) the bottom electrode cup base 140 has a rectangular shape (in a horizontal plane) defining four lateral sides, and the bottom electrode cup sidewall 142 includes four bottom electrode cup sidewall sections 142a-142d (sidewall sections 142a and 142c are visible in FIG. 1) collectively defining a closed-loop rectangular perimeter, each bottom electrode cup sidewall section 142a-142d extending upwardly from a respective lateral side of the rectangular bottom electrode cup base 140; and (b) the insulator cup base 148 similarly has a rectangular shape (in a horizontal plane) defining four lateral sides, and the insulator cup sidewall 150 includes four insulator cup sidewall sections 150a-150d (sidewall sections 150a and 150c are visible in FIG. 1) collectively defining a closed-loop rectangular perimeter, each insulator cup sidewall section 150a-150d extending upwardly from a respective lateral side of the rectangular insulator cup base 148.

The cross-sectional view shown in FIG. 1 shows bottom electrode cup sidewall sections 142a and 142c and insulator cup sidewall sections 150a and 150c. For a more complete view, the top view of FIG. 2H discussed below shows all four bottom electrode cup sidewall sections 142a-142d and insulator cup sidewall sections 150a-150d.

In other examples, the bottom electrode cup base 140 and insulator cup base 148 may have any other shape, e.g., circular or N-sided polygon, and the bottom electrode cup sidewall 142 and insulator cup sidewall 150 may each include any suitable number of sidewall sections, or may be formed as a respective tube.

As discussed below in more detail, a vertical height of the bottom electrode cup sidewall 142 may be shortened prior to forming the insulator 124, by removing an upper portion or "lip" of the bottom electrode cup sidewall 142 (e.g., using a CMP process with a soft/deformable pad), thus allowing the formation of the rounded insulator flange 146 that covers the upper surface 143 of the shortened bottom electrode cup sidewall 142. The rounded insulator flange 146 insulates the top electrode 122 from the upper surface 143 of the bottom electrode cup sidewall 142, to prevent shorting between the top electrode 122 and bottom electrode 120.

In some examples, insulator 124 may comprise silicon nitride (SiN) with a thickness of in the range of 250-750 Å. Alternatively, insulator 124 may comprise $Al_2O_3$, $ZrO_2$, $HfO_2$, $ZrSiO_x$, $HfSiO_x$, $HfAlO_x$, or $Ta_2O_5$, or other suitable capacitor insulator material.

The top electrode 122 fills an interior opening defined by the insulator cup 144, and may include a top electrode cap region 158 extending laterally over at least a portion of the rounded insulator flange 146, such that at least a portion of the rounded insulator flange 146 is arranged between the top electrode cap region 158 and the upper surface 143 of the bottom electrode cup sidewall 142. The top electrode 122 may comprise Al, Ti, TiN, W, TiW, Co, Ta, TaN, Cu, or any combination thereof, for example, TiN plus Al, TiN plus W, or a Ta/TaN bilayer plus Cu.

The MIM capacitor 102 also includes a top electrode connection pad 160 and a bottom electrode connection pad 162 formed in the upper metal layer $M_{x+1}$ concurrently with the upper interconnect element 112, e.g., as discussed below with reference to FIG. 2J. The top electrode connection pad 160 may be formed directly on the top electrode 122. The bottom electrode connection pad 162 may be connected to the bottom electrode base 134 by the bottom electrode contact 164. The bottom electrode contact 164 may be formed laterally spaced apart from the bottom electrode cup 136 and laterally spaced apart from interconnect vias 114, and may have a shape and size similar to interconnect vias 114. In some examples, MIM capacitor 102 may have multiple bottom electrode contacts 164.

Each of the top electrode connection pad 160 and bottom electrode connection pad 162 may have any suitable shape and size. For example, each of the top electrode connection pad 160 and bottom electrode connection pad 162 may have a square or rectangular shape in the x-y plane. In another example (not shown) each of the top electrode connection pad 160 and bottom electrode connection pad 162 may have a generally circular shape in the x-y plane. As another example, the top electrode connection pad 160 and/or bottom electrode connection pad 162 may be substantially elongated, e.g., running laterally across the wafer in the x-direction and/or the y-direction.

The top electrode 122 is capacitively coupled to both the bottom electrode cup base 140 and the bottom electrode cup sidewalls 142 of the bottom electrode cup 136 (which bottom electrode cup 136 is conductively coupled to the bottom electrode base 134), which defines a substantially larger area of capacitive coupling between the top electrode 122 and bottom electrode 120, as compared with conventional designs. In particular, MIM capacitor module 102 defines the following capacitive couplings between the top electrode 122 and bottom electrode 120:

(a) capacitive coupling between the top electrode 122 and bottom electrode 120 by a displacement current path through the insulator cup base 148 and through the bottom electrode cup base 140; and (b) capacitive coupling between the top electrode 122 and bottom electrode 120 by a displacement current path through each vertically-extending insulator cup sidewall 150 and through the corresponding vertically-extending bottom electrode cup sidewall 142.

The laterally-extending insulator cup base 148 effectively defines a plate capacitor, with the top and bottom plates extending horizontally (x-y plane), and each of the four insulator cup sidewall sections 150a-150d effectively defines an additional plate capacitor, with the top and bottom plates extending vertically (x-z plane or y-z plane). Thus, MIM capacitor module 102 may be referred to as a "three-dimensional" or "3D" MIM capacitor. Due to the capacitive coupling area between the top electrode 122 and bottom electrode 120 (e.g., as compared with conventional designs), the MIM capacitor module 102 may be formed in a smaller footprint on the respective chip, thus allowing an increased density of capacitors and/or other structures on the chip.

As mentioned above, a vertical height of the bottom electrode cup sidewall 142 may be shortened (e.g., by a planarization process using a deformable polishing pad) to allow the formation of the rounded insulator flange 146 covering the bottom electrode cup sidewall upper surface 143, to thereby prevent or reduce shorting between the top electrode 122 (e.g., at the top electrode cap region 158) and bottom electrode 120.

Based on the above, the lower interconnect element 110 of interconnect structure 104 and the bottom electrode base 134 of the MIM capacitor module 102 may each comprise a metal structure formed concurrently in the lower metal layer $M_x$. Similarly, the upper interconnect element 112 of interconnect structure 104, and the top electrode connection pad 160 and bottom electrode connection pad 162 of the MIM capacitor module 102, may each comprise a metal structure formed concurrently in the upper metal layer $M_{x+1}$.

Each of the lower metal layer $M_x$ and upper metal layer $M_{x+1}$ may comprise any metal or metalized layer or layers. For example, each of the lower metal layer $M_x$ and upper metal layer $M_{x+1}$ may comprise a copper or aluminum interconnect layer, bond pad layer, or other metal layer. As another example, the lower metal layer $M_x$ may be a silicided polysilicon layer (e.g., where $M_x$ is $M_0$), as discussed below.

Metal structures may be formed in the lower metal layer $M_x$ and upper metal layer $M_{x+1}$, respectively, in any suitable manner, for example using a subtractive patterning process (e.g., deposition, patterning, and etching of a metal layer), or using a damascene process, or by forming a metal silicide region on patterned polysilicon regions, or any other suitable process.

In the example shown in FIG. 1, lower interconnect element 110 and bottom electrode base 134 comprise aluminum structures formed in lower metal layer $M_x$ (using a subtractive patterning process); top electrode 122 comprises an aluminum structure formed in via layer $V_x$ (using a damascene process); and upper interconnect element 112, top electrode connection pad 160, and bottom electrode connection pad 162 comprise aluminum structures formed in upper metal layer $M_{x+1}$ (using a subtractive patterning process).

In another example, lower interconnect element 110 and bottom electrode base 134 are formed in a silicided polysilicon layer $M_x$, e.g., wherein $M_x=M_0$. In such example, lower interconnect element 110 and bottom electrode base 134 respectively comprise a metal silicide region formed on a respective polysilicon region.

Thus, the bottom electrode cup 136, insulator 124, top electrode 122, and bottom electrode contact 164 may be formed concurrently with the interconnect vias 114 in the via layer $V_x$ between the lower metal layer $M_x$ and upper metal layer $M_{x+1}$, e.g., using a damascene process as discussed below, and without adding any additional photomasks to the background IC fabrication process.

FIGS. 2A-2J show an example method of forming the example IC structure 100 shown in FIG. 1, including MIM capacitor module 102 and interconnect structure 104. As noted above, in other examples, the interconnect structure 104 may be optional, such that MIM capacitor module 102 may be formed by the process described below but with the elements of interconnect structure 104.

Figure 2A:
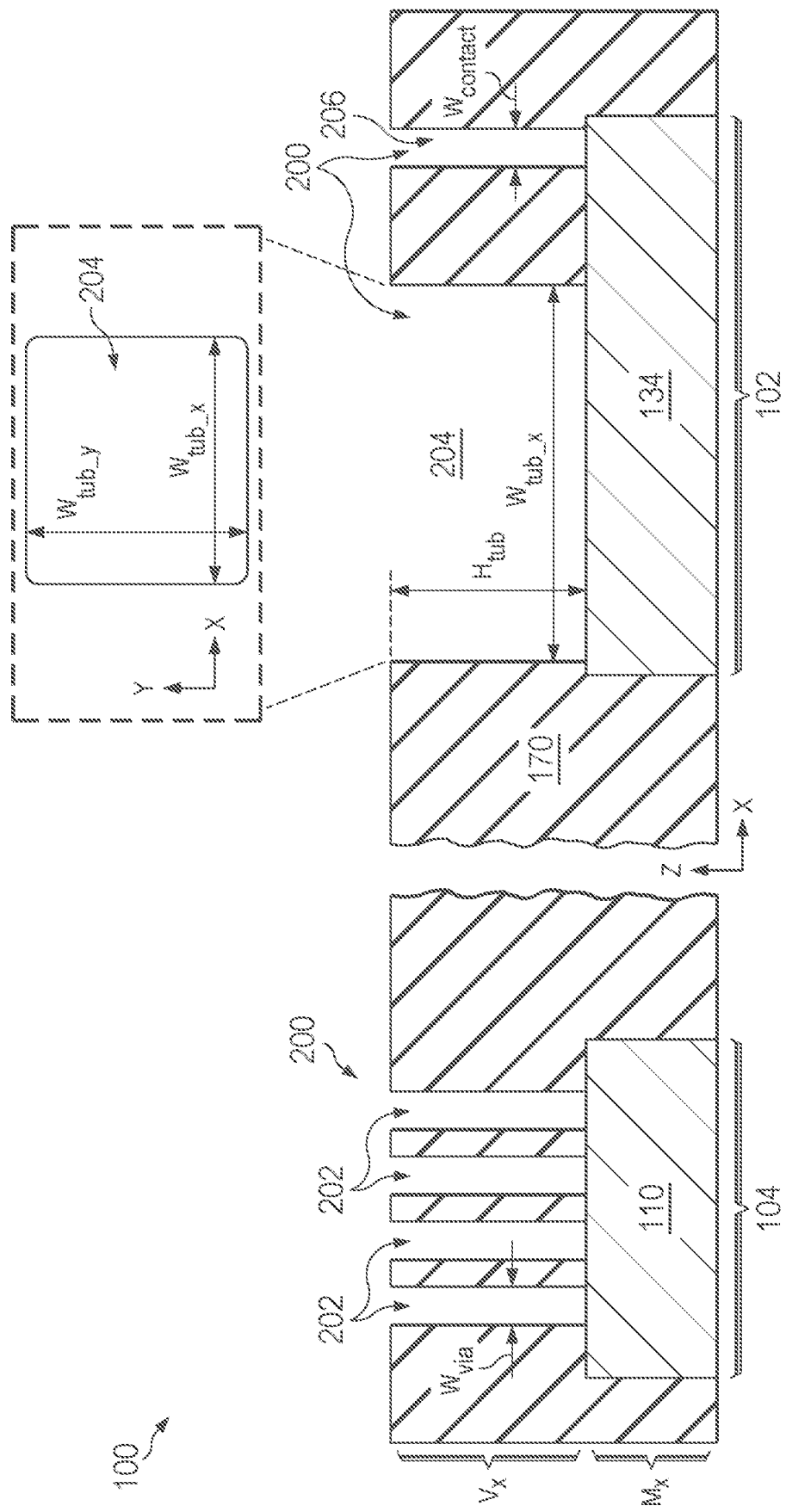
FIGS. 2A-2J show an example method of forming the example IC structure shown in FIG. 1, including a MIM capacitor module and interconnect structure.
Figure 3:
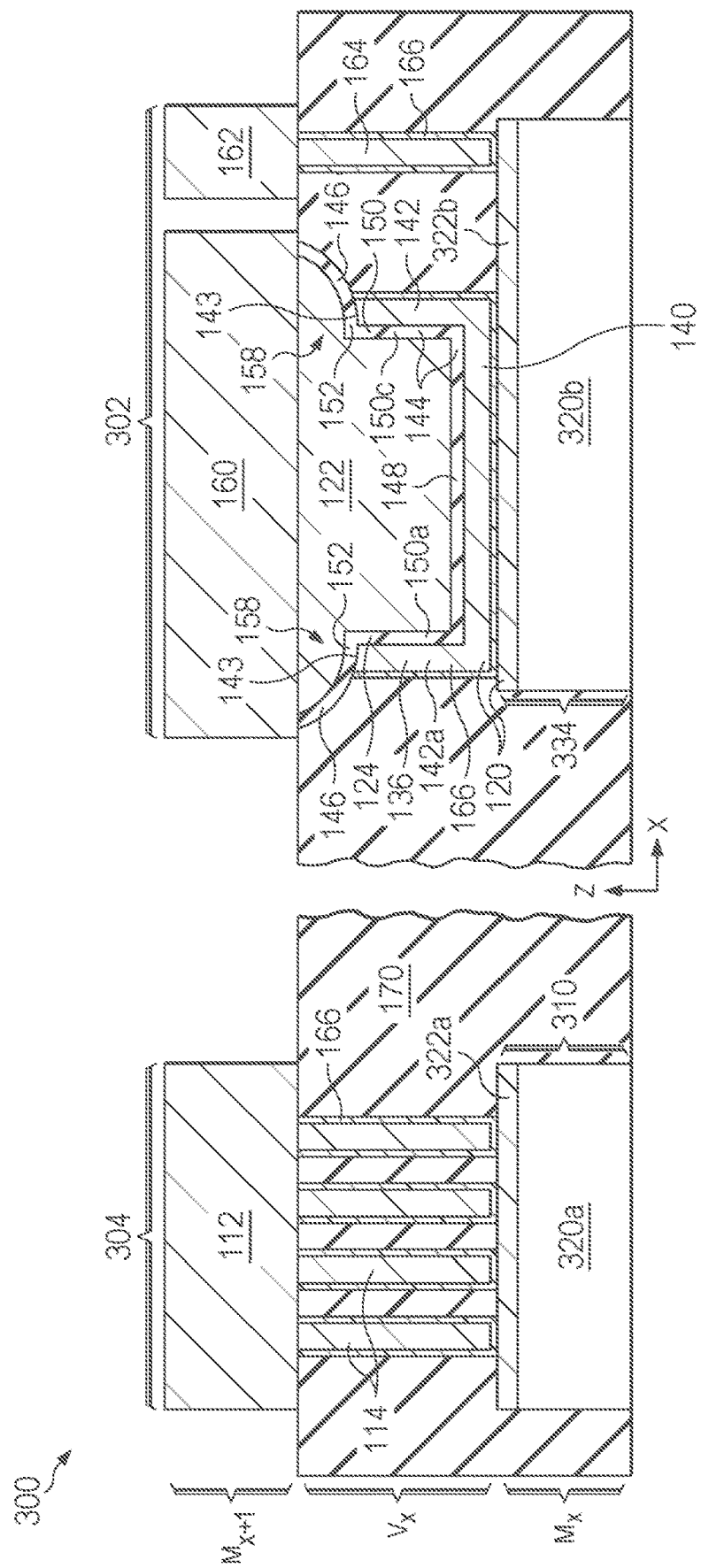
FIG. 3 is a side cross-sectional view showing an example IC structure including an MIM capacitor module and an interconnect structure formed on a lower metal layer comprising a silicided polysilicon layer.

As shown in FIG. 2A, the lower interconnect element 110 and the bottom electrode base 134 are formed in the lower metal layer $M_x$. In this example, the lower metal layer $M_x$ may comprise a metal interconnect layer, wherein the lower interconnect element 110 and bottom electrode base 134 are respectively formed as metal elements (e.g., aluminum elements). In another example, e.g., as shown in FIG. 3 discussed below, the lower metal layer $M_x$ may comprise a silicided polysilicon layer, wherein the lower interconnect element and bottom electrode base respectively comprise a silicide region formed on a respective polysilicon structure.

Dielectric region 170 (e.g., an Inter Metal Dielectrics (IMD) region or Poly Metal Dielectrics (PMD) region) is formed over the lower interconnect element 110 and bottom electrode base 134 formed in lower metal layer $M_x$. Dielectric region 170 may include one or more dielectric materials, e.g., silicon oxide, PSG (phosphosilicate glass), FSG (fluorine doped glass), or a combination thereof.

Via layer openings 200, including interconnect via openings 202, a tub opening 204, and a bottom electrode contact opening 206, may be patterned (using a photomask) and etched in the dielectric region 170. Via layer openings 200 may be formed using a plasma etch or other suitable etch, followed by a resist strip or other suitable process to remove remaining portions of photoresist material.

The interconnect via openings 202 may be via openings having a width (or diameter or Critical Dimension (CD)) $W_{via}$ in both the x-direction and y-direction in the range of 0.1-0.5 μm, for example.

The bottom electrode contact opening 206 may be formed as a via opening with a width (or diameter or Critical Dimension (CD)) $W_{contact}$. In some examples, the bottom electrode contact opening 206 is formed the same as the respective interconnect via openings 202, thus $W_{via}=W_{contact}$, and may have similar dimensions in both the x-direction and y-direction.

In contrast, tub opening 204 may have a substantially larger width in the x-direction ($W_{tub\_x}$) and/or y-direction ($W_{tub\_y}$) than interconnect via openings 202 and the bottom electrode contact opening 206. The shape and dimensions of the tub opening 204 may be selected based on various parameters, e.g., for effective manufacturing of the MIM capacitor module 102 (e.g., effective deposition of the top electrode material (e.g., aluminum) into the tub opening 204) and/or for desired performance characteristics of the resulting MIM capacitor module 102. In one example, the tub opening 204 may have a square or rectangular shape from the top view. In other examples, tub opening 204 may have a circular or oval shape from the top view.

As noted above, a width of tub opening 204 in the x-direction ($W_{tub\_x}$) y-direction ($W_{tub\_y}$), or both the x-direction and y-direction ($W_{tub\_x}$ and $W_{tub\_y}$) may be substantially larger than the width $W_{via}$ of interconnect via openings 202 in the x-direction, y-direction, or both the x-direction and y-direction. For example, in some examples, each width $W_{tub\_x}$ and $W_{tub\_y}$ of tub opening 204 is at least twice as large as the width $W_{via}$ of interconnect via openings 202. In particular examples, each width $W_{tub\_x}$ and $W_{tub\_y}$ of tub opening 204 is at least five time as large or at least 10 times as large as the width $W_{via}$ of interconnect via openings 202. In some examples, $W_{tub\_x}$ and $W_{tub\_y}$ are each in the range of 1-100 μm.

Further, tub opening 204 may be formed with a height-to-width aspect ratio of less than or equal to 1.0 in both the x-direction and y-direction, e.g., to allow effective filling of the tub opening 204 by conformal materials. For example, tub opening 204 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of tub opening 204 by conformal materials, e.g., tungsten or silicon nitride. For example, tub opening 204 may be formed with aspect ratios $H_{tub}/W_{tub\_x}$ and $H_{tub}/W_{tub\_y}$ respectively in the range of 0.1-1.0, or more particularly in the range of 0.5-1.0.

Figure 2B:
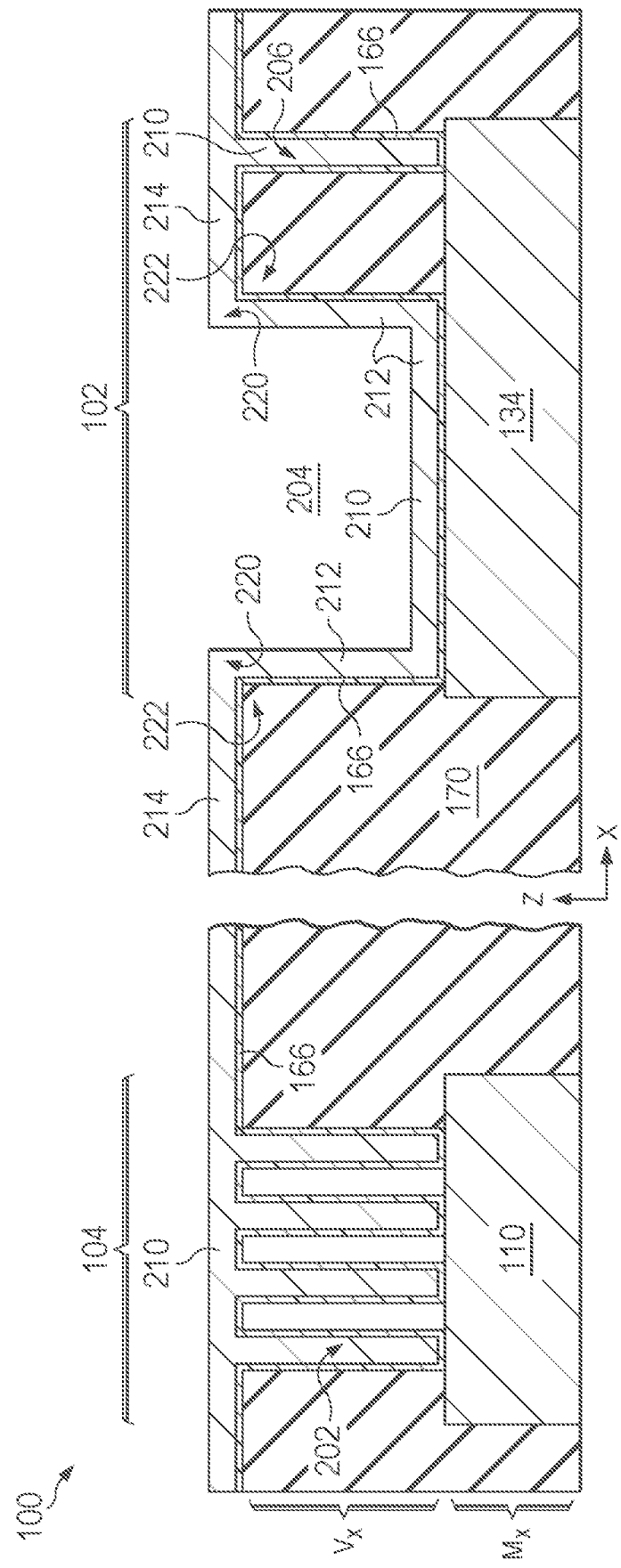

Next, as shown in FIG. 2B, a liner (or "glue layer") 166, e.g., comprising TiN, is deposited over the structure and extends into respective via layer openings 200. A conformal metal layer 210 is deposited over the liner 166 and extends into each respective via layer opening 200, thereby filling respectively interconnect via openings 202, filling the bottom electrode contact opening 206, and forming a cup-shaped conformal metal layer region 212 in the tub opening, extending down from a lateral conformal metal layer region 214, the lateral conformal metal layer region 214 extending laterally outwardly from a top of the cup-shaped conformal metal region 212. In one example, the conformal metal layer 210 comprises tungsten deposited with a thickness in the range of 1000 Å-5000 Å. In other examples, the conformal metal layer 210 may comprise Co, TiN, or other conformal metal. The conformal metal layer 210 may be deposited by a conformal chemical vapor deposition (CVD) process or other suitable deposition process.

Next, a vertical height of the cup-shaped conformal metal layer region 212 may be shortened by a corner removal process that removes (a) a conformal metal corner region 220 of the conformal metal layer 210 at a corner defined between the cup-shaped conformal metal layer region 212 and the lateral conformal metal layer region 214 and (b) an underlying dielectric corner region 222 of the dielectric region 170 at the top of the tub opening 204. As explained below, this corner removal process may define a bottom electrode cup 136 having a vertically-recessed upper surface 143 upon which a rounded insulator flange 146 may be formed, providing an electrical insulation between a subsequently formed top electrode 122 and the bottom electrode cup 136.

Figure 2C:
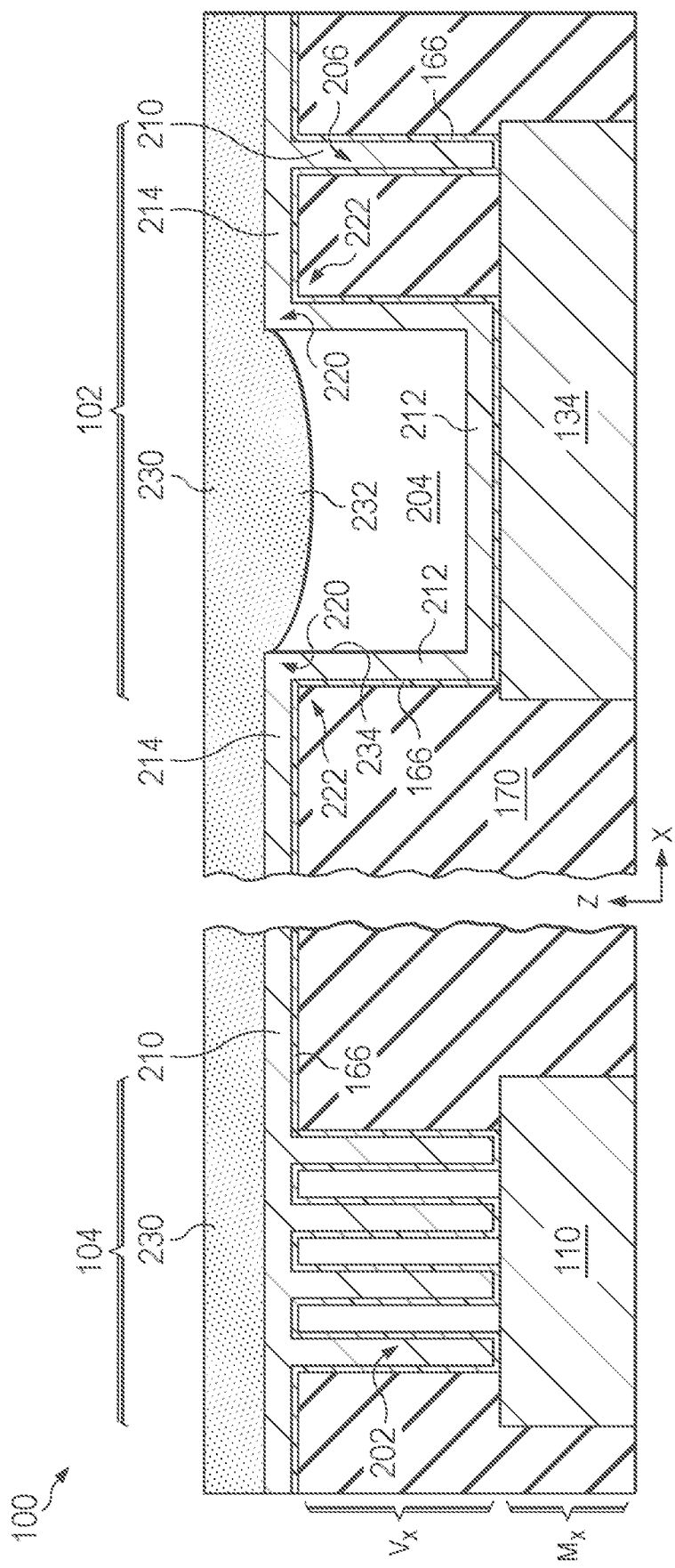
Figure 2D:
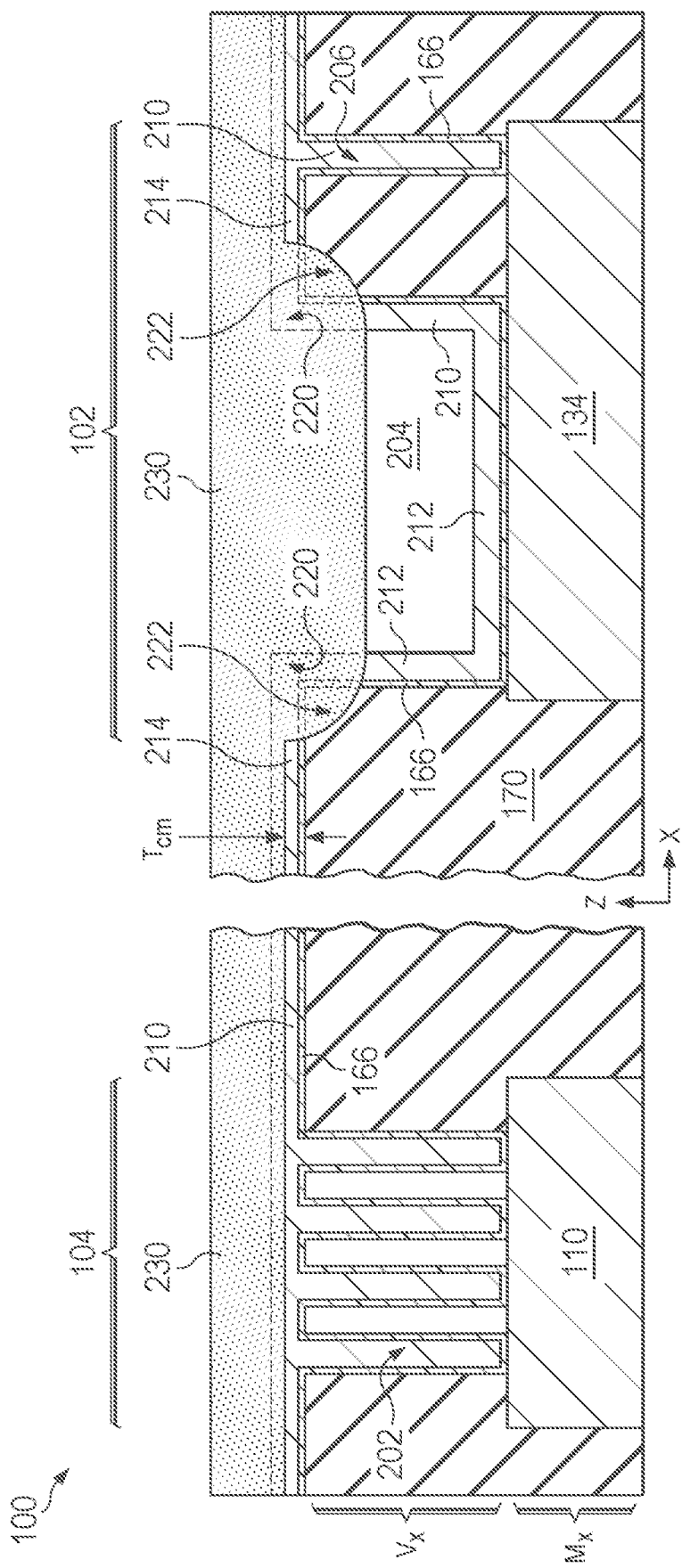
Figure 2E:
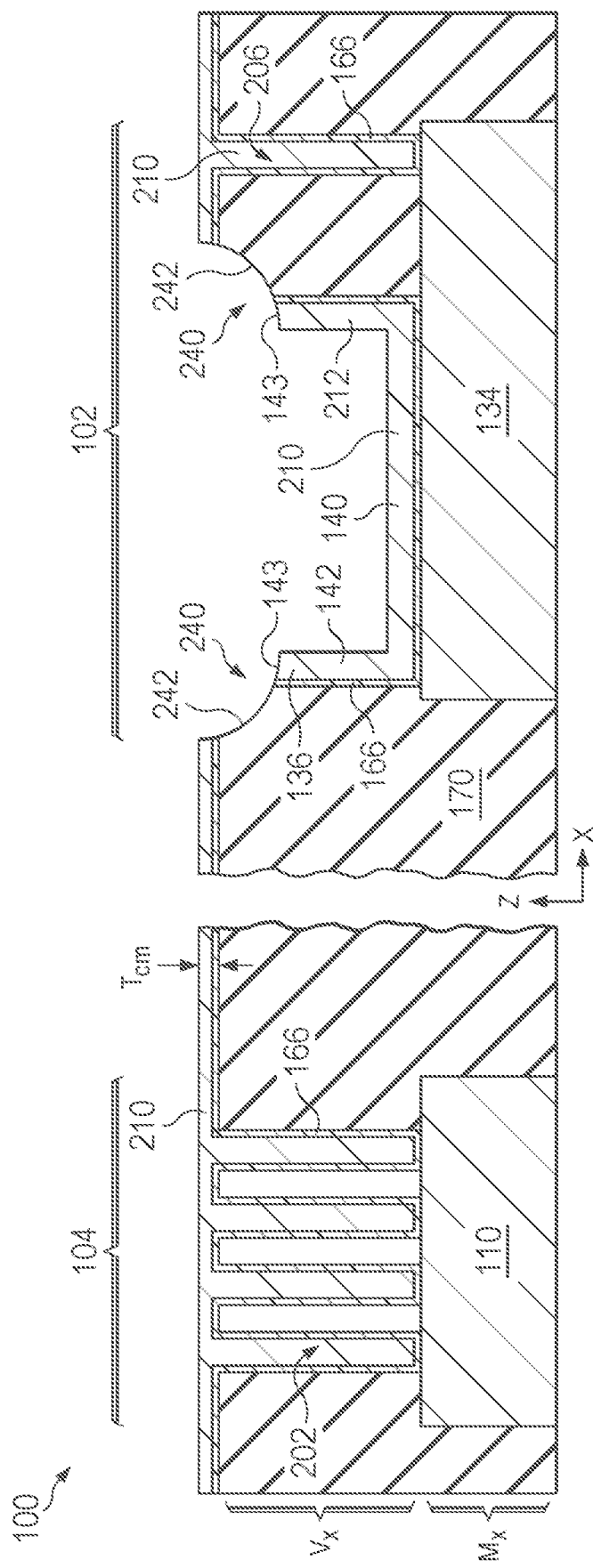

FIGS. 2C-2E show one example corner removal process for removing the conformal metal corner region 220 and dielectric corner region 222, resulting in a bottom electrode cup 136 having a vertically-recessed upper surface 143. As discussed below, the example corner removal process involves a CMP process using a soft/deformable polishing pad (also called a buffering pad) to remove the conformal metal corner region 220 and dielectric corner region 222.

As shown in FIG. 2C, a soft polishing pad 230 is positioned on a top surface of the conformal metal layer 210. The soft polishing pad 230 may be a soft/deformable polishing pad, typically used for final polishing (or buffing) of silicon, oxide, glass, or metal structures, for example. The soft or deformable polishing pad 230 may have a Shore D hardness below 40 Shore D, e.g., according to ASTM D2240 or ISO 868 standards. In some examples, the soft or deformable polishing pad 230 may have a Shore D hardness below 25 Shore D. In some examples, the soft polishing pad 230 may comprise a polyurethane having a vertically-oriented pore structure formed on a compressible substrate. For example, the polishing pad 230 may comprise a Politex™ Pad (having a Shore D hardness of about 16) from DuPont de Nemours, Inc., of Wilmington, Delaware. (In contrast, a typical CMP hard pad, for example a IC1000™ CMP polishing pad from DuPont de Nemours, Inc., may have a hardness in the range of about 52-62 Shore D.)

As shown in FIG. 2C, due to the deformable character of the soft polishing pad 230, a portion of the soft polishing pad 230 indicated at 232 may protrude downwardly into a tub opening 234 defined by the cup-shaped conformal metal layer region 212, e.g., due to a compressive force on the soft polishing pad 230. In one example, the polishing is performed from below, with the soft polishing pad 230 located below the IC structure 100 (i.e., upside down from the orientation shown in FIG. 2C).

Next, as shown in FIG. 2D, a CMP polishing process is performed using the soft polishing pad 230, wherein the soft polishing pad 230 (a) erodes the lateral conformal metal layer region 214 of the conformal metal layer 210, which reduces a vertical thickness $T_{cm}$ of the conformal metal layer 210, and also (b) erodes the conformal metal corner region 220 and underlying dielectric corner region 222 as a result of the soft polishing pad 230 deforming into the tub opening 234.

FIG. 2E shows the resulting structure after the CMP polishing process is performed using the soft polishing pad 230. As shown, the ClVlP polishing process creates a rounded depression 240, having a rounded depression surface 242, at the location of the (removed) conformal metal corner region 220 and dielectric corner region 222. The remaining portion of the cup-shaped conformal metal layer region 212 defines the bottom electrode cup 136 including the laterally-extending bottom electrode cup base 140 and bottom electrode cup sidewall 142 extending upwardly therefrom, wherein the upper surface 143 of the bottom electrode cup sidewall 142 is defined by the rounded depression surface 242.

Figure 2F:
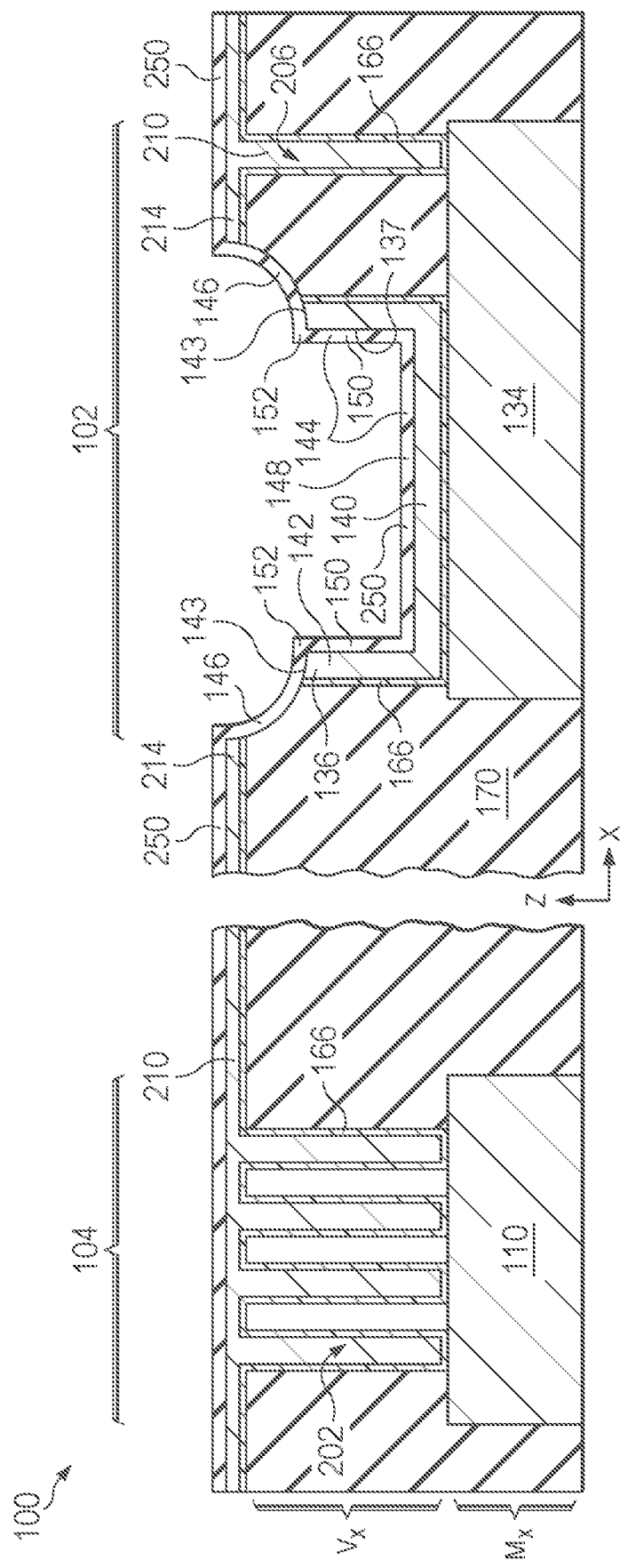

Next, as shown in FIG. 2F, an insulator layer 250 is deposited over the structure, and defines (a) the insulator cup 144 including the insulator cup base 148 and insulator cup sidewall 150 extending upwardly therefrom, and (b) the rounded insulator flange 146 extending laterally outwardly and curving upwardly from the upper edge 152 of the insulator cup sidewall 150, and covering the upper surface 143 of the bottom electrode cup sidewall 142. In some examples, the rounded insulator flange 146 may extend around the full perimeter (in the x-y plane) of the insulator cup sidewall 150, such that the rounded insulator flange 146 covers the upper surface 143 of the bottom electrode cup sidewall 142 around the full perimeter (in an x-y plane) of the bottom electrode cup sidewall 142.

In some examples, insulator layer 250 may comprise silicon nitride (SiN) deposited with a thickness of in the range of 250-750 Å by a Plasma Enhanced Chemical Vapor Deposition (PECVD) process. Alternatively, insulator layer 250 may comprise $Al_2O_3$, $ZrO_2$, $HfO_2$, $ZrSiO_x$, $HfSiO_x$, HfAlOx, or $Ta_2O_5$, or other suitable capacitor insulator material deposited using an Atomic Layer Deposition (ALD) process.

Figure 2G:
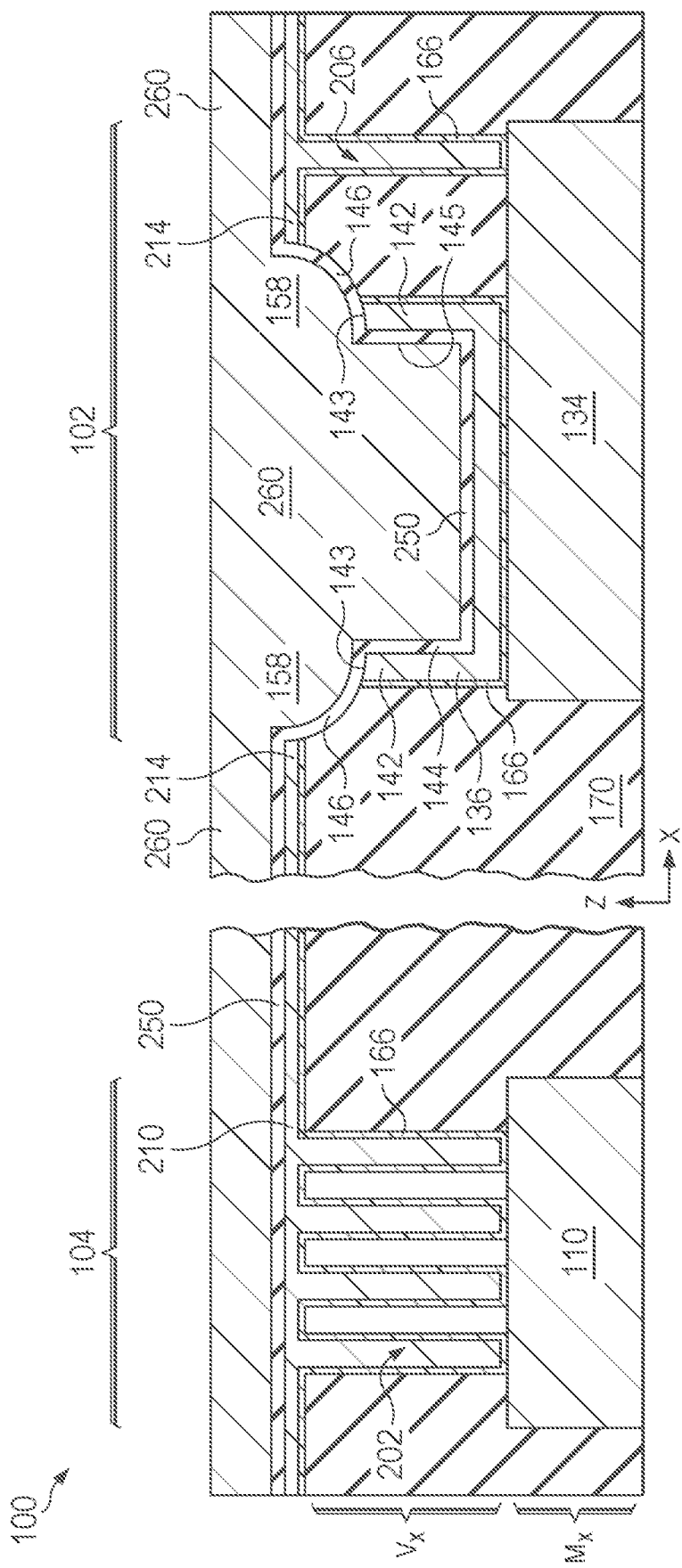

Next, as shown in FIG. 2G, a top electrode layer 260 is deposited over the insulator layer 250 and extends into and fills an interior opening 145 defined by the insulator cup 144. In some examples, top electrode layer 240 may comprise Al, Ti, TiN, W, or a combination thereof, for example TiN and Al, and may be deposited by a physical vapor deposition (PVD) process. The top electrode layer 260 includes the top electrode cap region 158 extending over the rounded insulator flange 146, such that the rounded insulator flange 146 is arranged between the top electrode cap region 158 and the upper surface 143 of the bottom electrode cup sidewall 142.

Figure 2H:
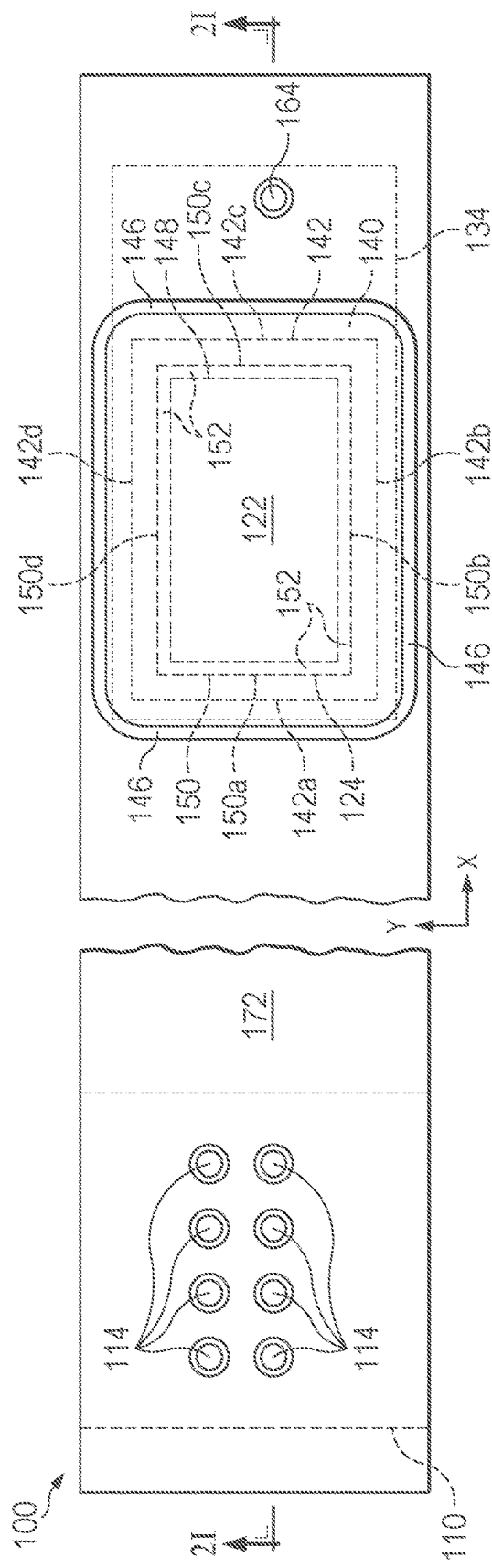
Figure 2I:
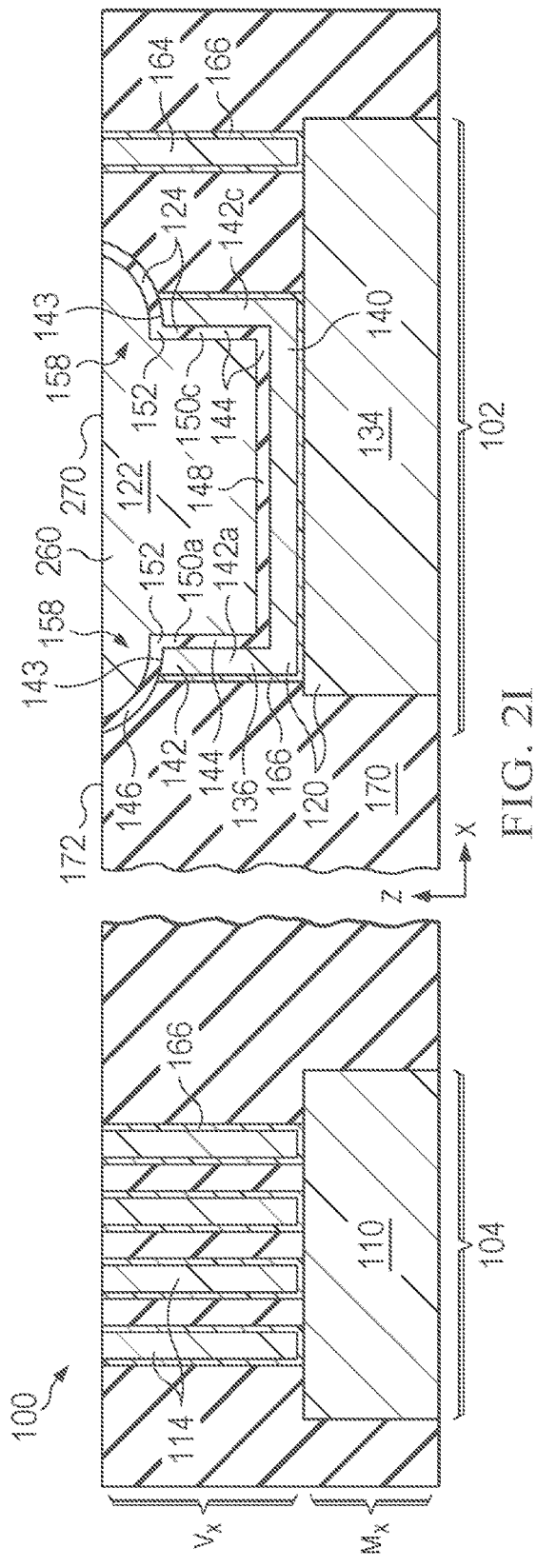

Next, as shown in FIGS. 2H and 2I, a second CMP process is performed to remove upper portions of the top electrode layer 260, insulator layer 250, and conformal metal layer 210. FIG. 2H shows a top view of the resulting structure after the CMP process, and FIG. 2I shows a side cross-sectional view taking through line 2I-2I shown in FIG. 2H. The CMP process defines a planarized top surface 172 including a planarized top surface 270 of the top electrode layer 122. After the CMP process, a remaining portion of the top electrode layer 260 defines the final form of the top electrode 122, and a remaining portion of the insulator layer 250 defines the final form of the insulator 124 including the insulator cup 144 and rounded insulator flange 146.

As shown in FIGS. 2H and 2I viewed together, the bottom electrode cup 136 includes a bottom electrode cup base 140 having a rectangular shape, and the bottom electrode cup sidewall 142 includes four bottom electrode cup sidewall sections 142a-142d extending upwardly (in the z-direction) from the rectangular bottom electrode cup base 140 and defining a closed-loop rectangular shape (in an x-y plane) of the bottom electrode cup sidewall 142. Similarly, the insulator cup 144 includes a laterally-extending insulator cup base 148 having a rectangular shape, and the insulator cup sidewall 150 includes four insulator cup sidewall sections 150a-150d extending upwardly (in the z-direction) from the rectangular laterally-extending insulator cup base 148 and defining a closed-loop rectangular shape (in an x-y plane). As discussed above, the rounded insulator flange 146 extends laterally outwardly (in the x-direction) and curves upwardly (in the z-direction) from the upper edge 152 of the insulator cup sidewall 150, around the rectangular perimeter (in the x-y plane) of the insulator cup sidewall 150, such that the rounded insulator flange 146 covers the upper surface 143 of the bottom electrode cup sidewall 142 around the rectangular perimeter (in an x-y plane) of the bottom electrode cup sidewall 142. The rounded insulator flange 146 may extend laterally outwardly (in the x-direction) and curve upwardly (in the z-direction) from the upper edge 152 of the insulator cup sidewall 150, around the rectangular perimeter (in the x-y plane) of the insulator cup sidewall 150, such that the rounded insulator flange 146 covers the upper surface 143 of the bottom electrode cup sidewall 142 around the full rectangular perimeter (in an x-y plane) of the bottom electrode cup sidewall 142.

By reducing the height of the bottom electrode cup sidewall 142 and forming an insulator 124 having a rounded insulator flange 146 extending over the upper surface 143 of the bottom electrode cup sidewall 142, a top electrode connection pad 160 (see FIG. 2J discussed below) may be formed directly on the planarized top surface 270 of the top electrode 122, and covering the full planarized top surface 270, without creating a short with the bottom electrode 120.

Figure 2J:
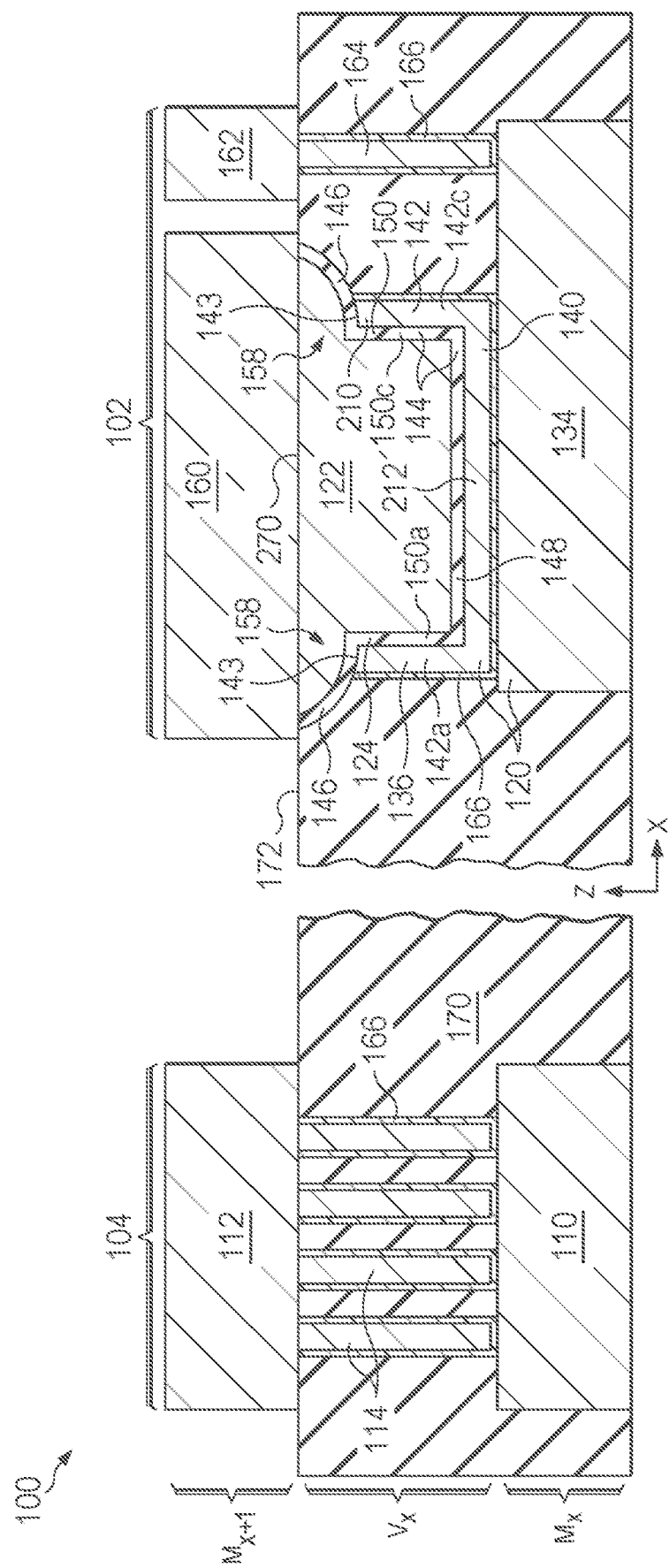

Thus, as shown in FIG. 2J, an upper metal layer ($M_{x+1}$ layer) may be formed on the planarized upper surface 172 of the via layer $V_x$. Various metal elements are formed in the upper metal layer $M_{x+1}$ (e.g., by a metal deposition, pattern, and etch process) including (a) the upper interconnect element 112 connected to interconnect vias 114, (b) the top electrode connection pad 160 connected to the top electrode 122, and (c) the bottom electrode connection pad 162 connected to the bottom electrode contact 164. The upper metal layer $M_{x+1}$ may comprise aluminum or other suitable metal. As shown, the top electrode connection pad 160 may be formed directly on the full planarized top surface 270 of the top electrode 122, and may be insulated from the bottom electrode cup 136 by the rounded insulator flange 146, to thereby prevent electrical shorts between the top connection pad 160 (and thus the top electrode 122) and the bottom electrode 120.

FIG. 3 is a side cross-sectional view showing an example IC structure 300 including an MIM capacitor module 302 and an interconnect structure 304 formed on a lower metal layer $M_x$ comprising a silicided polysilicon layer. In this example, a lower interconnect element 310 of interconnect structure 304 and the bottom electrode base 334 of the MIM capacitor module 302 may each comprises a metal silicide region formed on a respective polysilicon region. In particular, lower interconnect element 310 comprises a first metal silicide region 322a formed on a first polysilicon region 320a, and bottom electrode base 334 comprises a second metal silicide region 322b formed on a second polysilicon region 320b.

The invention claimed is:

1. A metal-insulator-metal (MIM) capacitor module, comprising:
    a bottom electrode cup including:
        a laterally-extending bottom electrode cup base; and
        a bottom electrode cup sidewall extending upwardly from the laterally-extending bottom electrode cup base;
    an insulator including:
        an insulator cup formed in an opening defined by the bottom electrode cup; and
        a rounded insulator flange extending laterally outwardly and curving upwardly from the insulator cup, the rounded insulator flange covering an upper surface of the bottom electrode cup sidewall;
    a top electrode formed in an opening defined by the insulator cup;
    wherein the top electrode is insulated from the upper surface of the bottom electrode cup sidewall by the rounded insulator flange; and
    wherein the top electrode has a planarized top surface; and
    a top electrode connection pad formed on a planarized top surface of the top electrode, the top electrode connection pad fully covering the planarized top surface of the top electrode.

2. The MIM capacitor module of claim 1, wherein the top electrode includes a top electrode cap region adjacent the rounded insulator flange, wherein the rounded insulator flange is arranged between the top electrode cap region and the upper surface of the bottom electrode cup sidewall.

3. The MIM capacitor module of claim 2, wherein the top electrode connection pad extends laterally over the top electrode cap region.

4. The MIM capacitor module of claim 1, comprising:
    a bottom electrode base;

wherein the bottom electrode cup is formed on the bottom electrode base;
a bottom electrode contact spaced laterally apart from the bottom electrode cup, the bottom electrode contact conductively connected to the bottom electrode base; and
a bottom electrode connection pad formed over the bottom electrode contact and conductively connected to the bottom electrode contact.

5. The MIM capacitor module of claim 4, wherein:
the bottom electrode base is formed in a lower metal layer; and
the top electrode connection pad and the bottom electrode connection pad are formed in an upper metal layer.

6. The MIM capacitor module of claim 5, wherein:
the lower metal layer comprises a silicide polysilicon layer; and
the upper metal layer comprises an interconnect metal layer.

7. The MIM capacitor module of claim 4, wherein the bottom electrode cup and the bottom electrode contact are formed from a conformal metal.

8. The MIM capacitor module of claim 1, wherein:
the insulator cup includes an insulator cup sidewall including multiple insulator cup sidewall segments defining a closed-loop perimeter of the insulator cup sidewall, the insulator cup sidewall having a sidewall upper edge extending around the closed-loop perimeter of the insulator cup sidewall; and
the rounded insulator flange extends radially outwardly from the sidewall upper edge and extends around the closed-loop perimeter of the insulator cup sidewall.

9. The MIM capacitor module of claim 1, wherein the top electrode connection pad fully covers the insulator.

10. The MIM capacitor module of claim 1, wherein:
the rounded insulator flange has an upper surface coplanar with the planarized top surface of the top electrode; and
the top electrode connection pad fully covers the upper surface of the rounded insulator flange.

11. The MIM capacitor module of claim 1, comprising:
a planarized surface defining an upper surface of the bottom electrode cup, an upper surface of the insulator, and an upper surface of the top electrode;
wherein the top electrode connection pad is formed on the planarized surface.

12. The MIM capacitor module of claim 1, wherein the top electrode fully fills the opening defined by the insulator cup.

13. An integrated circuit structure, comprising:
an interconnect structure comprising:
a lower interconnect element;
an upper interconnect element; and
an interconnect via between the lower interconnect element and the upper interconnect element, and
a metal-insulator-metal (MIM) capacitor module comprising:
a bottom electrode cup including:
a laterally-extending bottom electrode cup base; and
a bottom electrode cup sidewall extending upwardly from the laterally-extending bottom electrode cup base;
an insulator including:
an insulator cup formed in an opening defined by the bottom electrode cup; and
a rounded insulator flange extending laterally outwardly and curving upwardly from the insulator cup, the rounded insulator flange covering an upper surface of the bottom electrode cup sidewall;
a top electrode formed in an opening defined by the insulator cup;
wherein the top electrode is insulated from the upper surface of the bottom electrode cup sidewall by the rounded insulator flange; and
wherein the top electrode has a planarized top surface;
a top electrode connection pad formed on a planarized top surface of the top electrode and fully covering the planarized top surface of the top electrode; and
wherein the bottom electrode cup and the interconnect via are formed in a common dielectric region.

14. The integrated circuit structure of claim 13, wherein the top electrode includes a top electrode cap region extending laterally over the rounded insulator flange, wherein the rounded insulator flange is arranged between the top electrode cap region and the upper surface of the bottom electrode cup sidewall.

15. The integrated circuit structure of claim 13, wherein the bottom electrode cup and the interconnect via are formed from a common conformal metal in the common dielectric region.

16. The integrated circuit structure of claim 13, comprising:
a bottom electrode base;
wherein the bottom electrode cup is formed on the bottom electrode base;
a bottom electrode contact spaced laterally apart from the bottom electrode cup and spaced laterally apart from the interconnect via, the bottom electrode contact conductively connected to the bottom electrode base; and
a bottom electrode connection pad conductively connected to the bottom electrode contact.

17. The integrated circuit structure of claim 16, wherein:
the lower interconnect element and the bottom electrode base are formed in a lower metal layer;
the upper interconnect element, the top electrode connection pad, and the bottom electrode connection pad are formed in an upper metal layer; and
the bottom electrode contact is formed in the common dielectric region.

18. A metal-insulator-metal (MIM) capacitor module, comprising:
a bottom electrode base;
a bottom electrode cup, including:
a laterally-extending bottom electrode cup base formed on the bottom electrode base; and
a bottom electrode cup sidewall extending upwardly from the laterally-extending bottom electrode cup base;
an insulator including:
an insulator cup formed in an opening defined by the bottom electrode cup; and
a rounded insulator flange extending laterally outwardly and curving upwardly from the insulator cup, the rounded insulator flange covering an upper surface of the bottom electrode cup sidewall;
a top electrode formed in an opening defined by the insulator cup;
wherein the top electrode is insulated from the upper surface of the bottom electrode cup sidewall by the rounded insulator flange;

a bottom electrode contact spaced laterally apart from the bottom electrode cup, the bottom electrode contact conductively connected to the bottom electrode base; and a bottom electrode connection pad formed over the bottom electrode contact and conductively connected to the bottom electrode contact.

19. The MIM capacitor module of claim 18, comprising:

a top electrode connection pad formed over and conductively connected to the top electrode;

wherein the top electrode connection pad is spaced apart from the bottom electrode connection pad; and wherein the top electrode connection pad and the bottom electrode connection pad are formed in an upper metal layer.

20. The MIM capacitor module of claim 18, wherein:

the bottom electrode cup comprises a first portion of a conformal metal layer; and the bottom electrode contact comprises a second portion of the conformal metal layer.

* * * * *